(12) United States Patent
Gorbics et al.

(10) Patent No.: US 6,859,813 B2
(45) Date of Patent: *Feb. 22, 2005

(54) PARALLEL DECIMATION CIRCUITS

(75) Inventors: Mark Steven Gorbics, Franklin Lakes, NJ (US); Keith Michael Roberts, Chester, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 605 days.

This patent is subject to a terminal disclaimer.

(21) Appl. No.: 10/013,568

(22) Filed: Dec. 11, 2001

(65) Prior Publication Data

US 2003/0110194 A1 Jun. 12, 2003

(51) Int. Cl.[7] ............................................. G06F 17/17
(52) U.S. Cl. ...................................... 708/313; 708/290
(58) Field of Search ................................ 708/290, 313

(56) References Cited

U.S. PATENT DOCUMENTS 6,347,233 B1 * 2/2002 Solar et al. ............... 455/553.1
6,470,365 B1 * 10/2002 Rahman et al. ............. 708/313

* cited by examiner

*Primary Examiner*—Chuong Dinh Ngo
(74) *Attorney, Agent, or Firm*—Frommer Lawrence & Haug LLP; William S. Frommer; Darre Simon

(57) ABSTRACT

A decimation system and decimation circuit for decimating waveform data on an oscilloscope. The decimation circuit is implemented using sixteen parallel 16-to-1 multiplexers connected in parallel to a data bus which selectively captures samples based on control signals generated by a sample counting circuit. Decimation factor and phase values can be input to program the amount of decimation performed by the circuit. The decimation system provides even more flexibility in controlling the decimation and is formed by combining several of the decimation circuits with corresponding analog-to-digital converters and memory segments.

13 Claims, 8 Drawing Sheets

| 95 | 94 | 93 | (92) | 91 | 90 | 89 | 88 | 87 | 86 | 85 | 84 | 83 | (82) | 81 | 80 | 5 |
| 79 | 78 | 77 | 76 | 75 | 74 | 73 | (72) | 71 | 70 | 69 | 68 | 67 | 66 | 65 | 64 | 4 |
| 63 | (62) | 61 | 60 | 59 | 58 | 57 | 56 | 55 | 54 | 53 | (52) | 51 | 50 | 49 | 48 | 3 |
| 47 | 46 | 45 | 44 | 43 | (42) | 41 | 40 | 39 | 38 | 37 | 36 | 35 | 34 | 33 | (32) | 2 |
| 31 | 30 | 29 | 28 | 27 | 26 | 25 | 24 | 23 | (22) | 21 | 20 | 19 | 18 | 17 | 16 | 1 |
| 15 | 14 | 13 | (12) | 11 | 10 | 9 | 8 | 7 | 6 | 5 | 4 | 3 | (2) | 1 | 0 | 0 |

| 152 | 142 | 132 | 122 | 112 | 102 | 92 | 82 | 72 | 62 | 52 | 42 | 32 | 22 | 12 | 2 | output |
| 9 | 8 | 8 | 7 | 7 | 6 | 5 | 5 | 4 | 3 | 3 | 2 | 2 | 1 | 0 | 0 | clock |
| 8 | 14 | 4 | 10 | 0 | 6 | 12 | 2 | 8 | 14 | 4 | 10 | 0 | 6 | 12 | 2 | locale |

Figure 2

| 95 | 94 | 93 | 92 | 91 | 90 | 89 | 88 | 87 | 86 | 85 | 84 | 83 | (82) | 81 | 80 | 5 |
|----|----|----|----|----|----|----|----|----|----|----|----|----|------|----|----|---|
| 79 | 78 | 77 | 76 | 75 | 74 | 73 | 72 | 71 | 70 | 69 | 68 | 67 | 66 | 65 | 64 | 4 |
| 63 | 62 | 61 | 60 | 59 | 58 | 57 | 56 | 55 | 54 | 53 | 52 | 51 | 50 | 49 | 48 | 3 |
| 47 | 46 | 45 | 44 | 43 | (42) | 41 | 40 | 39 | 38 | 37 | 36 | 35 | 34 | 33 | 32 | 2 |
| 31 | 30 | 29 | 28 | 27 | 26 | 25 | 24 | 23 | 22 | 21 | 20 | 19 | 18 | 17 | 16 | 1 |
| 15 | 14 | 13 | 12 | 11 | 10 | 9 | 8 | 7 | 6 | 5 | 4 | 3 | (2) | 1 | 0 | 0 |

| 600 | 562 | 522 | 482 | 442 | 402 | 362 | 322 | 282 | 242 | 202 | 162 | 122 | 82 | 42 | 2 | output |
|-----|-----|-----|-----|-----|-----|-----|-----|-----|-----|-----|-----|-----|----|----|----|--------|
| 37 | 35 | 32 | 30 | 27 | 25 | 22 | 20 | 17 | 15 | 12 | 10 | 7 | 5 | 2 | 0 | clock |
| 10 | 2 | 10 | 2 | 10 | 2 | 10 | 2 | 10 | 2 | 10 | 2 | 10 | 2 | 10 | 2 | locale |

Figure 3

PARALLEL DECIMATION CIRCUITS

BACKGROUND OF THE INVENTION

The present invention relates generally to a parallel decimation circuit for decimating waveform data on an oscilloscope.

Traditionally, digital storage oscilloscopes (DSOs) capture an electrical signal (waveform) and allow the user to view a trace of the captured signal in a time (x-axis) versus amplitude (y-axis) display. This is done by digitally sampling the waveform, thereby generating a number of samples. Current DSOs can acquire data at a rate of $10^9$ samples per second. At this rate, a gigabyte of storage is needed to cover one second of data. Storing this amount of data quickly exceeds the capacity of even the largest DSO memories. Furthermore, display screens lack the resolution to display this amount of data. Realistically, a display needs only about 1000 data points to produce a suitable trace of the waveform. Thus, to display a one second trace, almost $10^6$ samples are discarded between each of the display points.

For these reasons, DSOs commonly reduce the number of samples through a reduction operation called decimation. The decimation operation can be performed during acquisition of the waveform, storage of the samples, processing of the data, and/or rendering of the display. For most of these stages the decimation operation may be performed in software. However, during acquisition the software implementation is too slow to keep pace with the incoming data.

SUMMARY OF THE INVENTION

Therefore, a need exists for a capability to perform a real-time decimation operation during the acquisition of a waveform by an oscilloscope. Preferably, a solution to this problem should be cost effective and readily implementable.

It is therefore an object of the present invention to provide a circuit for performing a decimation operation in an oscilloscope.

It is a further object of the present invention to provide a system of multiple circuits for performing a decimation operation in an oscilloscope.

The preferred embodiment of the invention provides a decimation circuit for decimating waveform data on an oscilloscope. The decimation circuit has a sample counting circuit having N registers connected in series with one of N-1 adders positioned between each register pair (N is the number of data lines on a data bus). The sample counting circuit determines N outputs on the basis of a decimation factor value and a decimation phase value. Each output indicates a position of a data sample within the waveform data to remain after the decimation. The first of the registers is set to the decimation phase value as its indicated position. Each adder adds the decimation factor value to the output of the preceding register to produce the output for the next register as its indicated position. The decimation circuit also has a multiplexing circuit having N parallel multiplexers connected in series with N corresponding parallel output registers. Each multiplexer has N parallel inputs connected with the data lines of the data bus. Each multiplexer is controlled on the basis of one of the outputs from the sample counting circuit to select data samples from one of the data lines of the data bus. Each output register is enabled by an enable bit to receive data samples selected by the corresponding multiplexer.

Another aspect of the invention is the decimation circuit may further comprise N modulus circuits and N divide circuits. Each circuit is connected to one of the N outputs from the sample counting circuit and corresponds to a predetermined one of the N parallel multiplexers and output registers. Each modulus circuit generates a clock signal for controlling the selection of data samples by the corresponding multiplexer. Each divide circuit generates a locale signal for use in generating the enable bit for the corresponding output register.

Another aspect of the invention is the decimation circuit may further comprise an enable circuit having at least one counter connected to N parallel comparators. Each comparator compares a count value from the counter with the locale signal received from a corresponding one of the divide circuits to generate the enable bit for the corresponding output register. Typically, the count value sequences up to the decimation factor value then re-sequences.

A second embodiment of the invention provides a decimation system for decimating waveform data on an oscilloscope. The decimation system has a plurality of analog-to-digital converters for acquiring and generating data samples in parallel from an input waveform, a plurality of decimation circuits, a plurality of memory segments, and a processor for selecting data samples stored in the memory segments. Each decimation circuit is connected to a corresponding analog-to-digital converter and has a sample counting circuit having N registers connected in series with one of N-1 adders positioned between each register pair (N is the number of data lines on a data bus). The sample counting circuit determines N outputs on the basis of a decimation factor value and a decimation phase value. Each output indicates a position of a data sample within the waveform data to remain after the decimation. The first of the registers is set to the decimation phase value as its indicated position. Each adder adds the decimation factor value to the output of the preceding register to produce the output for the next register as its indicated position. The decimation circuit also has a multiplexing circuit having N parallel multiplexers connected in series with N corresponding parallel output registers. Each multiplexer has N parallel inputs connected with the data lines of the data bus. Each multiplexer is controlled on the basis of one of the outputs from the sample counting circuit to select data samples from one of the data lines of the data bus. Each output register is enabled by an enable bit to receive data samples selected by the corresponding multiplexer. Further, each memory segment stores data samples from a corresponding decimation circuit.

In the second embodiment, the parallel analog-to-digital converters may sample the waveform data at predetermined sequential times to generate the waveform data samples.

Another aspect of the second embodiment is the decimation circuit may further comprise N modulus circuits and N divide circuits. Each circuit is connected to one of the N outputs from the sample counting circuit and corresponds to a predetermined one of the N parallel multiplexers and output registers. Each modulus circuit generates a clock signal for controlling the selection of data samples by the corresponding multiplexer. Each divide circuit generates a locale signal for use in generating the enable bit for the corresponding output register.

Another aspect of the second embodiment is the decimation circuit may further comprise an enable circuit having at least one counter connected to N parallel comparators. Each comparator compares a count value from the counter with the locale signal received from one of the divide circuits to generate the enable bit for the corresponding output register.

Typically, the count value sequences up to the decimation factor value then re-sequences.

A second embodiment of the invention provides a method of decimating waveform data on an oscilloscope using a decimation circuit. The method first determines N outputs on the basis of a decimation factor value and a decimation phase value. Each output indicates a position of a data sample within the waveform data to remain after the decimation. The N outputs are determined in parallel using N registers connected in series with one of N-1 adders positioned between each register pair (where N is the number of data lines on a data bus). The method then sets the first of the registers to the decimation phase value as its indicated position and adds the decimation factor value to the output of the preceding register using each adder to produce the output for the next register as its indicated position. The method selects data samples of the waveform data as indicated by the N outputs from one of the data lines of the data bus. The data samples are selected using N parallel multiplexers. Each multiplexer being connected in series to one of N corresponding parallel output registers and having N parallel inputs connected with the data lines of the data bus and being controlled in accordance with a predetermined one of the N outputs. Each of the N output registers are then enabled using an enable bit to receive the data samples selected by the corresponding multiplexer.

Another aspect of the third embodiment is the method may further comprise the step of generating N clock signals on the basis of the N outputs for controlling the selection of data samples by the N parallel multiplexers, and generating N locale signals on the basis of the N outputs for use in generating the enable bits for the N output registers.

Another aspect of the third embodiment is the method may further comprise the step of comparing a count value from a counter with each of the N locale signals to generate the enable bits for the N output registers. Typically, the count value sequences up to the decimation factor value then re-sequences.

Other objects and advantages of the invention will in part be obvious and will in part be apparent from the specification and the drawings.

BRIEF DESCRIPTION OF THE DRAWINGS

For a more complete understanding of the invention, reference is made to the following description and accompanying drawings, in which:

FIG. 2 illustrates a {10,2} decimation on an input data sample by the decimation circuit according to the invention;

FIG. 3 illustrates a {40,2} decimation on an input data sample by the decimation circuit according to the invention;

DETAILED DESCRIPTION OF THE PREFERRED EMBODIMENTS

Figure 1:
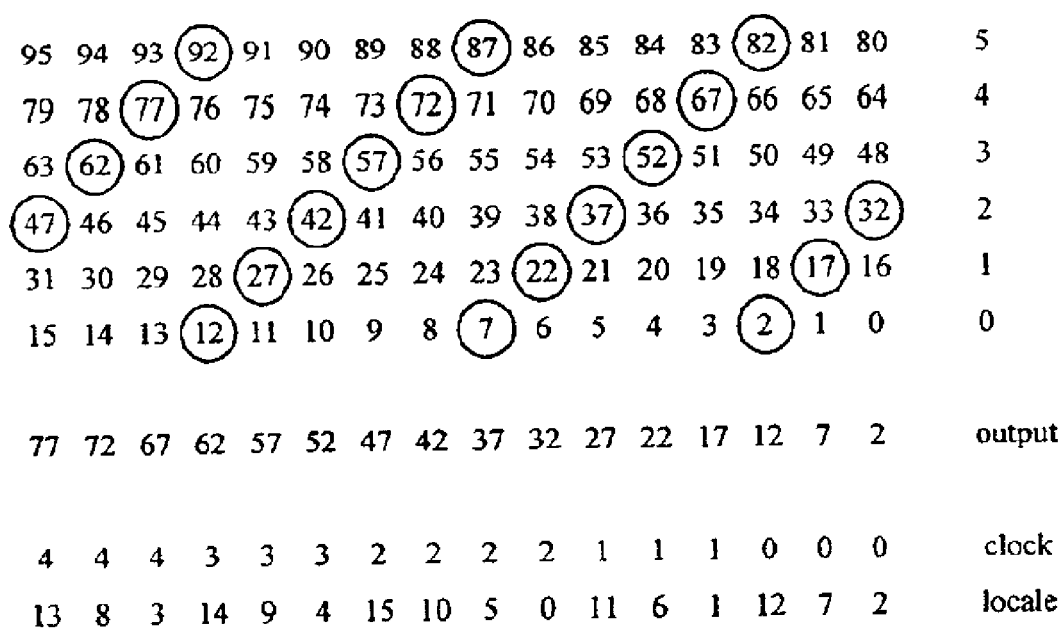
FIG. 1 illustrates a {5,2} decimation on an input data sample by the decimation circuit according to the invention.

The preferred embodiments of the circuit and system according to the present invention will be described with reference to the accompanying drawings.

The preferred embodiment of the invention is a parallel decimation circuit for use in a DSO. The parallel decimation circuit implementation is a synchronous digital circuit, embedded in a larger chip design. As mentioned previously, the decimation operation is typically performed in DSOs in software, albeit much more slowly than desired. The method used to perform the decimation in software is fundamentally different than the operation performed by the decimation circuit according to the invention; but the results are similar.

The parallel decimation circuit may be used to process data at any stage in the DSO. For example, the decimation circuit may be used to decimate input data during the acquisition stage. The decimation factor and the initial phase of the decimation are arbitrary and programmable, as will be discussed below.

The circuit performs decimation on a data bus that presents multiple words per clock cycle. In the examples provided below, the parallel decimation circuit is implemented on a data bus that is 16 samples wide, the output bus is the same width as the input bus, and a decimation by one is acceptable. Further, the data from this circuit is routed through a single memory segment, however the invention is not limited as such.

Before describing the circuit, a notation and algebra is developed herein to describe the decimation operation. If the data to be decimated consists of a sequence of samples denoted $\{s_0, s_1, s_2, s_3 \ldots\}$, then the decimation results in a periodic sampling of the data. For example, a decimation of the data by two produces the sequence $\{s_0, s_2, S_4, s_6 \ldots\}$.

Notice that there are two possible sequences for a decimation by two. The sequence $\{s_1, s_3, s_5, s_7 \ldots\}$ is also an acceptable decimation by two. These sequences are referred to as sequence {2,0} and sequence {2,1}. The first number in the ordered pair is the decimation factor and the second number is the phase. The phase is the number of samples skipped before the first sample is saved.

If S denotes any sequence of data, then {2,0} S is the result of performing a decimation of two, phase zero on the sequence S. A sequence of decimations can be expressed as for example {5,0} {2,0} {5,0}S={50,0}S.

When the offset is zero it is easy to prove that {B, 0} {A, 0}={B·A, 0}. Likewise, with a nonzero offset it is easy to verify that {B, b} {A, a}={B·A, A·b+a}. Further, note that decimations with nonzero phases do not commute, that is {A, a} {B, b}≠{B, b} {A, a}.

A plus sign (+) is used to indicate a merging of two sequences. In a merger, the order of the samples is always preserved. This allows sequences to be combined to form sequences with smaller decimations. All of the following theorems result from applying suitable decimations to a sequence {x, y}.

$$\{x, y\} = \{2x, y\} + \{2x, y+x\}$$

$$\{x, y\} = \{3x, y\} + \{3x, y+x\} + \{3x, y+2x\}$$

$$\{x, y\} = \{5x, y\} + \{5x, y+x\} + \{5x, y+2x\} + \{5x, y+3x\} + \{5x, y+4x\}$$

$$\{x, y\} = \{6x, y\} + \{6x, y+x\} + \{6x, y+2x\} + \{6x, y+3x\} + \{6x, y+4x\} + \{6x, y+5x\}$$

FIGS. 1–3 provide three examples of the decimation operation as performed in accordance with the invention. Each Figure shows a block of 96 data samples, numbered and arranged in six rows of 16 samples each. This is the configuration of the data as it arrives at the parallel decimation circuit. Each row corresponds to a clock cycle. In this example, the data bus is 16 samples wide, but the invention is not limited as such. The first row, labeled on the right as 0, is composed of the first 16 samples and the next row, labeled one, is composed of the next 16 samples, and so on.

FIG. 1 illustrates a {5,2} decimation on an input data sample by the decimation circuit according to the invention. This is a decimation by five with an initial phase of two ({5,2}). The circled samples are the data samples that are to remain after the decimation. On the first clock cycle, samples 2, 7, and 12 are moved to the output. The line labeled output indicates the samples which remain after the decimation. On the next clock cycle, samples 17, 22, and 27 are moved to the output, and so on. Note the third clock cycle (labeled 2) requires the transfer of four samples to the output. After five clock cycles the pattern repeats. Notice that because the samples have been numbered carefully, the sample number is just the phase, 2, with successive additions of the decimation factor, 5.

Next, the numbers are expressed in binary and the four least significant bits are separated from the four most significant bits. These numbers are shown in FIG. 1 as the two rows below the output row. The lower bit number becomes the "locale" and the higher bit number become the "clock." Notice that the locale is the position (0–15) of the data sample in the input word and the clock is the clock cycle on which the data was presented. This provides a prescription on how to enable a multiplexer (mux) to an output register in the decimation circuit and which clock cycle to wait for to capture the data.

FIG. 2 illustrates a {10,2} decimation on an input data sample (numbered similarly to that shown in FIG. 1) by the decimation circuit according to the invention. The factor of ten results in no data from odd numbered columns being selected.

FIG. 3 illustrates a {40,2} decimation on an input data sample by the decimation circuit according to the invention. Here the decimation factor is increased to 40. Note that data is not selected from every input data line. In addition, the pattern requires 37 clock cycles to fill the output line.

The details of the decimation circuit according to the invention are now explained by reference to FIGS. 4–7, which show the schematic implementation of the circuit. The decimation process is implemented using sixteen parallel 16-to-1 multiplexers connected in parallel to a data bus (an exemplary multiplexer is shown in FIG. 7) which selectively capture samples based on control signals generated by a sample counting circuit (FIG. 4).

Figure 4:
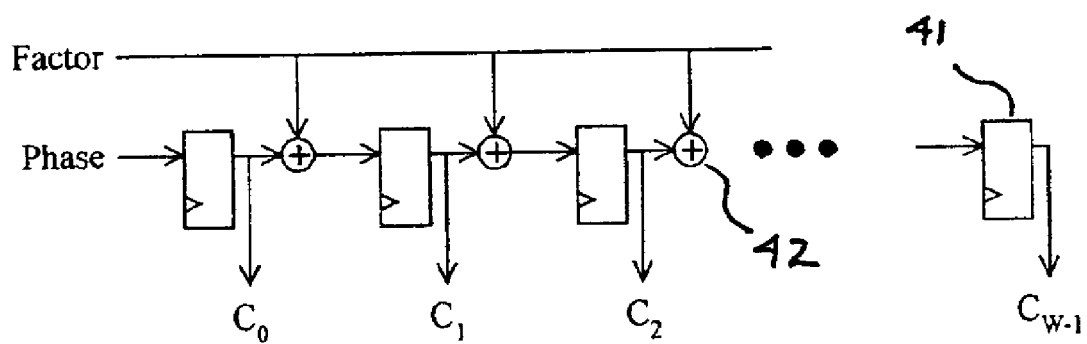
FIG. 4 is a sample counting portion of the parallel decimation circuit for determining the output line shown in FIGS. 1–3.

FIG. 4 is a sample counting portion of the parallel decimation circuit for determining the output (sample number) line shown in FIGS. 1–3. The phase and factor values are input at initialization in accordance with the desired decimation values. Phase and factor values are propagated through the circuit by input clock pulses such that each (D-type) register 41 stores a result $C_i$ that is the value of the previous register plus 42 the factor value. The results $C_0 \ldots C_{w-1}$ correspond to the number of the data samples that are to be output. Note that these results are the same as the output line shown in FIGS. 1 through 3. W is the width of the input data bus.

Figure 5:
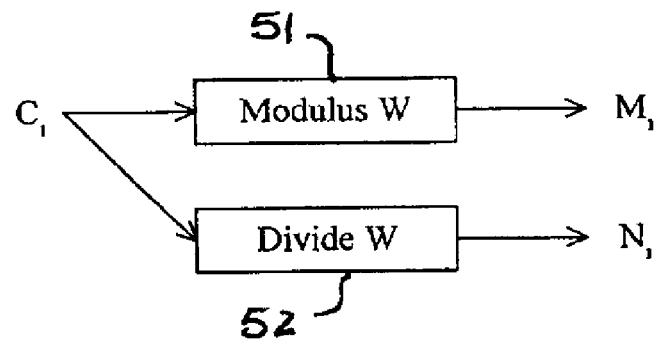
FIG. 5 is a modulus and divide portion of the parallel decimation circuit to account for the input bus width W.

FIG. 5 is a modulus and divide portion of the parallel decimation circuit to account for the input bus width W. Each output result $C_i$ from the circuit of FIG. 4 is fed through a copy of this part of the circuit. This part of the circuit is very simple if W is a power of two. In the above examples, W is 16 and the Modulus W 51 and Divide W 52 operations are simply a rearrangement of the data bits in $C_i$. The output values Mi and Ni correspond to the clock and locale values shown in FIGS. 1–3. Other values of W are possible, but result in this part of the circuit becoming more complex.

Figure 6:
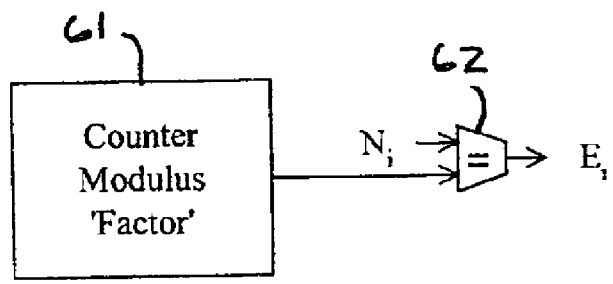
FIG. 6 is an enable bit portion of the parallel decimation circuit for calculating the enable bits $E_i$.
Figure 7:
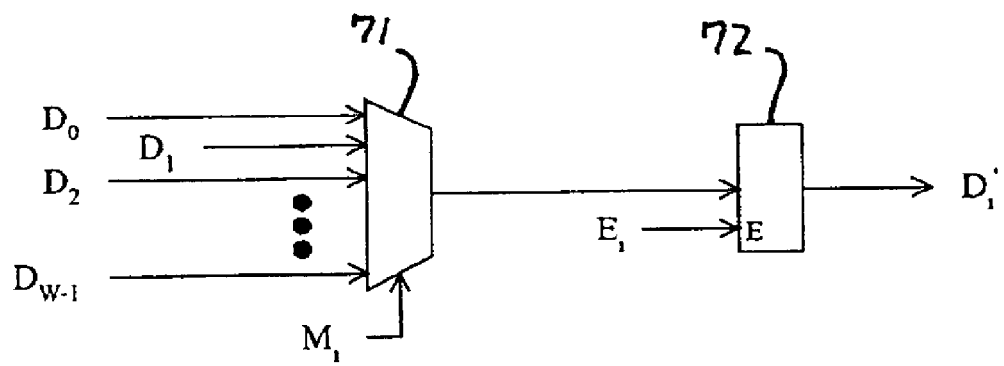
FIG. 7 is an exemplary multiplexing portion of the parallel decimation circuit for selecting the data samples to be captured.

FIG. 6 is an enable bit portion of the parallel decimation circuit for calculating the enable bits $E_i$. The counter modulus factor 61 is a counter which sequences up to the decimation factor. During initialization this counter 61 is zeroed. A table (not shown) for a clock number is also created at initialization. The valid data words on the input bus are counted. When the counter 61 is equal to the clock number, the corresponding output bytes are enabled. When the clock counter rolls over, the complete output is valid for one clock cycle. For each count, enable bits $E_i$ are computed.

FIG. 7 is an exemplary multiplexing portion of the parallel decimation circuit for selecting the data samples. As mentioned above, the parallel decimation circuit comprises 16 such multiplexers 71 in parallel. These multiplexers are configured at initialization and do not change until the next configuration. Each multiplexer is connected to receive each word on the data bus, $D_0$ to $D_{w-1}$. The multiplexer is set by the values of $M_i$, which are computed by the circuit part shown in FIG. 5. The multiplexer routes the correct input word to the output register 72. The output register is enabled by the enable bits $E_i$ computed by the circuit part shown in FIG. 6. The enable bits determine the correct time to capture the output data. A complete set of output data is ready when the counter 61 rolls over.

Another embodiment of the invention is a decimation system comprised of multiple parallel decimation circuits. Examples of the decimation system are now explained by reference to FIGS. 8–10. The decimation system is a higher level system approach that uses the features of the parallel decimation circuit described above. The decimation system uses multiple copies of the parallel decimation circuit in physically separate chips. In addition, the data from the decimation system is routed to separate memory segments. This approach can increase the overall throughput of the DSO.

Figure 8:
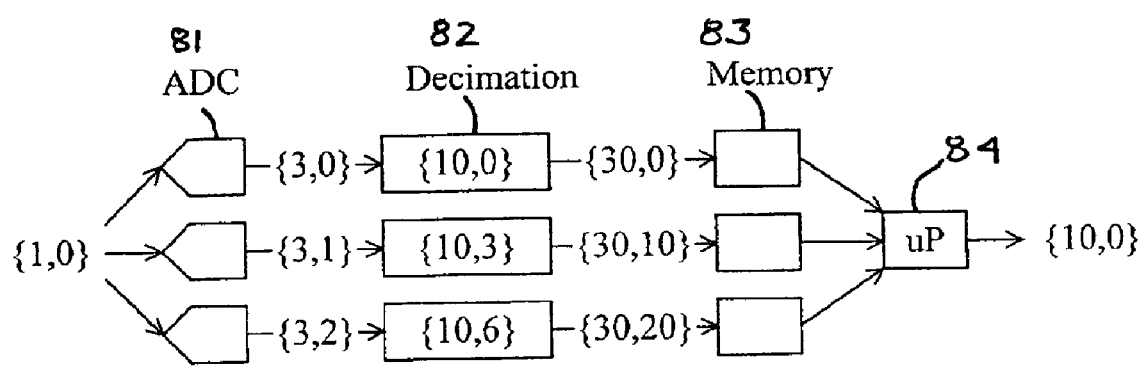
FIG. 8 is a system using multiple parallel decimation circuits according to the invention to perform a {10, 0} decimation.

FIG. 8 is a decimation system using multiple parallel decimation circuits according to the invention to perform a {10, 0} decimation. This system is comprised of three interleaved analog-to-digital converters (ADCs) 81 and three parallel decimation circuits 82, and makes use of three memory segments 83 and the DSO microprocessor 84. The waveform is input on the left and split between the three ADCs that convert the waveform to sampled digital data. Hence, the ADCs generate a sequence that is decimated by three. The data is input to the three parallel decimation circuits that perform further decimation as programmed and the data is stored in respective memory segments. The microprocessor is then able to select the desired output data from the memory segments. Alternatively, one or more of the decimation operations 82 may be implemented in software rather than as a parallel decimation circuit.

The following explains the mathematical operation performed by the decimation system of FIG. 8. The objective is to create the sequence {10,0}, the complete sequence of samples decimated by ten. The input waveform is initially represented as the sequence of data {1,0}. This represents all samples of the input waveform. However, in reality the samples have not yet been created, since sampling is done in the ADCs. As discussed above, each interleaved ADC only measures every third sample of the complete waveform. Thus, the sequences generated by the ADCs are labeled {3,0}, {3,1}, and {3,2}. Note, the phases of the sequences are arbitrary, but must be different from each other. Using the theorems discussed hereinabove, the output sequence {10, 0}, and the ADC sequences, one can backsolve to find the necessary values for each decimation block as follows:

$$\{10, 0\}=\{30, 0\}+\{30, 10\}+\{30, 20\}$$

$$\{10, 0\}=\{10, 0\}\{3,0\}+\{10, s\}\{3,1\}+\{10, t\}\{3,2\}$$

This equation is satisfied when s=3 and t=6. Thus the decimation blocks must be programmed to {10, 0}, {10, 3}, and {10, 6}.

Remember the decimation operation does not commute, so the ordering is important. If s and t are not whole numbers, the decimation is not possible. If the decimation factor (10 in this example) and the number of ADCs (3) have a greatest common divisor larger than one, then decimation is not possible without wasting a memory segment. If the greatest common divisor is one, the decimation is possible.

Figure 9:
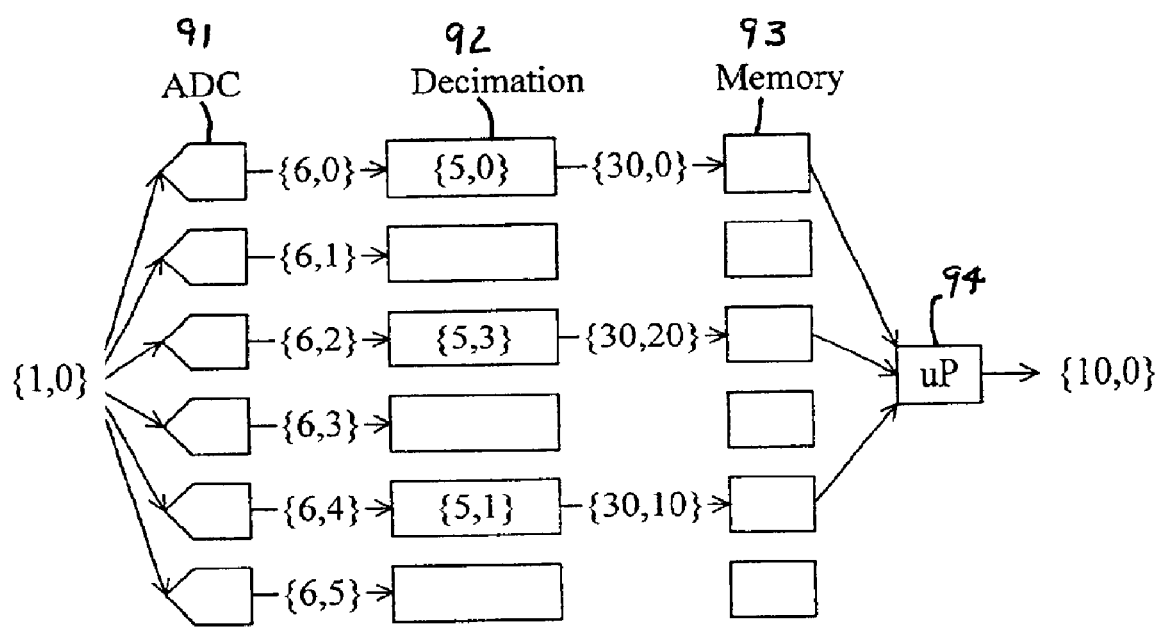
FIG. 9 is an alternate system using multiple parallel decimation circuits according to the invention to perform a {10, 0} decimation.
Figure 10:
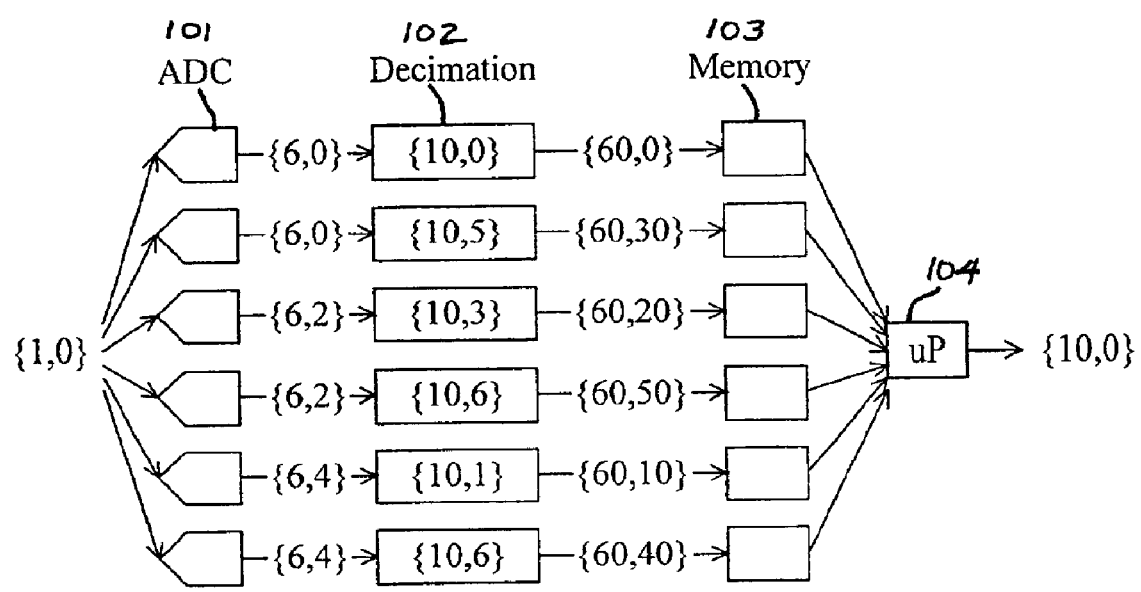
FIG. 10 is another alternate system using multiple parallel decimation circuits according to the invention to perform a {10, 0} decimation.

FIGS. 9 and 10 are alternate systems using multiple plural decimation circuits 92, 102 according to the invention to perform a {10, 0} decimation. The following systems show the situation where the number of ADCs (6) and the decimation factor (10) have a greatest common divisor of two.

As shown in FIG. 9, the first, third and fifth ADCs 91 contribute no data to the final sequence. Further, the memory blocks 93 associated with these ADCs are wasted, i.e. they store no useful data. To solve this problem, additional data paths could be created to the unused memory blocks, but this is costly.

In FIG. 10, the system has been modified to allow for multiple ADCs 101 to sample at the same time. As shown, the ADCs that were previously generating unusable data in FIG. 9 are now generating redundant data. The decimation circuits 102 are now used to distribute the data into all the memory segments 103, thus eliminating the waste of those segments.

While a preferred embodiment of the present invention has been described using specific terms, such description is for illustrative purposes only, and it is to be understood that changes and variations may be made without departing from the spirit or scope of the following claims.

What is claimed is:

1. A decimation circuit for decimating waveform data on an oscilloscope, comprising:

a sample counting circuit having N registers connected in series with one of N-1 adders positioned between each register pair, where N is the number of data lines on a data bus; the sample counting circuit determining N outputs on the basis of a decimation factor value and a decimation phase value, each output indicating a position of a data sample within the waveform data to remain after decimation; the first of the registers being set to the decimation phase value as its indicated position, each adder adding the decimation factor value to the output of the preceding register to produce the output for the next register as its indicated position; and a multiplexing circuit having N parallel multiplexers, each being connected in series to one of N corresponding parallel output registers; each multiplexer having N parallel inputs connected with the data lines of said data bus and being controlled in accordance with a predetermined one of the outputs from said sample counting circuit to select data samples from one of the data lines of the data bus as indicated by said predetermined one of the outputs; each of said N output registers being enabled by an enable bit to receive data samples selected by the corresponding multiplexer.

2. The decimation circuit according to claim 1, further comprising N modulus circuits and N divide circuits, each being connected to one of said N outputs from said sample counting circuit, each corresponding to a predetermined one of the N parallel multiplexers and output registers; each modulus circuit generating a clock signal for controlling the selection of data samples by the corresponding multiplexer; each divide circuit generating a locale signal for use in generating said enable bit for the corresponding output register.

3. The decimation circuit according to claim 2, further comprising an enable circuit having at least one counter connected to N parallel comparators; each comparator comparing a count value from the counter with the locale signal received from a corresponding one of the divide circuits to generate said enable bit for the corresponding output register.

4. The decimation circuit according to claim 3, wherein said count value sequences up to said decimation factor value then re-sequences.

5. A decimation system for decimating waveform data on an oscilloscope, comprising:

a plurality of analog-to-digital converters for acquiring and generating data samples in parallel from an input waveform;

a plurality of decimation circuits connected in parallel, each decimation circuit being connected to a predetermined corresponding one of said analog-to-digital converters and having:

a sample counting circuit having N registers connected in series with one of N-1 adders positioned between each register pair, where N is the number of data lines on a data bus; the sample counting circuit determining N outputs on the basis of a decimation factor value and a decimation phase value, each output indicating a position of a data sample within the waveform data to remain after decimation; the first of the registers being set to the decimation phase value as its indicated position, each adder adding the decimation factor value to the output of the preceding register to produce the output for the next register as its indicated position; and a multiplexing circuit having N parallel multiplexers, each being connected in series to one of N corresponding parallel output registers; each multiplexer having N parallel inputs connected with the data lines of said data bus and being controlled in accordance with a predetermined one of the outputs from said sample counting circuit to select data samples from one of the data lines of the data bus as indicated by said predetermined one of the outputs; each of said N output registers being enabled by an enable bit to receive data samples selected by the corresponding multiplexer;

a plurality of memory segments, each memory segment for storing data samples from a predetermined corresponding one of said plurality of decimation circuits; and a processor for selecting data samples stored in said plurality of memory segments, thereby generating the decimated waveform data.

6. The decimation system according to claim 5, wherein said plurality of parallel analog-to-digital converters sample said waveform data at predetermined sequential times to generate waveform data samples.

7. The decimation system according to claim 5, wherein said plurality of decimation circuits further comprises N modulus circuits and N divide circuits connected to said N outputs from said sample counting circuit and corresponding to the N parallel multiplexers and output registers; each modulus circuit generating a clock signal for controlling the selection of data samples by the corresponding multiplexer; each divide circuit generating a locale signal for use in generating said enable bit for the corresponding output register.

8. The decimation system according to claim 7, wherein said plurality of decimation circuits further comprises an enable circuit having at least one counter connected to N parallel comparators; each comparator comparing a count value from the counter with the locale signal from one of the divide circuits to generate said enable bit for the corresponding output register.

9. The decimation system according to claim 8, wherein said count value sequences up to said decimation factor value then re-sequences.

10. A method of decimating waveform data on an oscilloscope using a decimation circuit, comprising the steps of:

determining N outputs on the basis of a decimation factor value and a decimation phase value, each output indicating a position of a data sample within the waveform data to remain after decimation; said N outputs being determined in parallel using N registers connected in series with one of N-1 adders positioned between each register pair, where N is the number of data lines on a data bus; setting the first of the registers to the decimation phase value as its indicated position and adding the decimation factor value to the output of the preceding register using each adder to produce the output for the next register as its indicated position; and selecting data samples of the waveform data as indicated by said N outputs from one of the data lines of said data bus; the data samples being selected using N parallel multiplexers, each being connected in series to one of N corresponding parallel output registers; each multiplexer having N parallel inputs connected with the data lines of said data bus and being controlled in accordance with a predetermined one of the N outputs from said determining step; enabling each of the N output registers using an enable bit to receive the data samples selected by the corresponding multiplexer.

11. The method according to claim 10, further comprising the step of generating N clock signals on the basis of said N outputs from said determining step for controlling the selection of data samples by the N parallel multiplexers, and generating N locale signals on the basis of the N outputs for use in generating the enable bits for the N output registers.

12. The method according to claim 10, further comprising the step of comparing a count value from a counter with each of the N locale signals to generate the enable bits for the N output registers.

13. The method according to claim 12, wherein said comparing step sequences said count value up to said decimation factor value then re-sequences the count value.

* * * * *

UNITED STATES PATENT AND TRADEMARK OFFICE
CERTIFICATE OF CORRECTION

| | | |
|---|---|---|
| PATENT NO. | : 6,859,813 B2 | Page 1 of 1 |
| APPLICATION NO. | : 10/013568 | |
| DATED | : February 22, 2005 | |
| INVENTOR(S) | : Mark Steven Gorbics et al. | |

It is certified that error appears in the above-identified patent and that said Letters Patent is hereby corrected as shown below:

Title page, item (*) Notice: Delete "This patent is subject to a terminal disclaimer"

Signed and Sealed this

Seventh Day of November, 2006

JON W. DUDAS
*Director of the United States Patent and Trademark Office*